US012701792B2

(12) United States Patent
Dai et al.

(10) Patent No.: US 12,701,792 B2
(45) Date of Patent: Aug. 4, 2026

(54) PV LAMINATE WITH SHINGLED PV CELLS AND METHODS OF ASSEMBLY

(71) Applicant: Maxeon Solar Pte. Ltd., Marina Bay Financial Centre (SG)

(72) Inventors: Mingchong Dai, Yantai City (CN); Jianfang Si, Kunshan City (CN); Qiang Zhang, Zhenjiang City (CN); Hongshuai Xu, Wuxi City (CN); Jialin Shen, Bozhou City (CN); Nicholas Berry, Beaverton, OR (US)

( * ) Notice: Subject to any disclaimer, the term of this patent is extended or adjusted under 35 U.S.C. 154(b) by 0 days.

(21) Appl. No.: 18/143,493

(22) Filed: May 4, 2023

(65) Prior Publication Data

US 2024/0372024 A1 Nov. 7, 2024

(51) Int. Cl.
        *H10F 19/80*          (2025.01)
        *H10F 71/00*          (2025.01)
(52) U.S. Cl.
        CPC ......... *H10F 19/807* (2025.01); *H10F 71/137* (2025.01)
(58) Field of Classification Search
        CPC ............. H01L 31/0488; H01L 31/1876; H10F 19/807; H10F 71/137
        See application file for complete search history.

(56) References Cited

U.S. PATENT DOCUMENTS

| | | | | | |
|---|---|---|---|---|---|
| 4,331,494 | A | * | 5/1982 | Duchateau | ............ H10F 19/807 156/331.7 |
| 2002/0153038 | A1 | * | 10/2002 | Umemoto | ........... B32B 17/1011 136/251 |

| | | | | | |
|---|---|---|---|---|---|
| 2012/0125391 | A1 | * | 5/2012 | Pinarbasi | ............ H01L 31/0504 257/E31.11 |
| 2013/0206213 | A1 | * | 8/2013 | He | ....................... H01L 31/0504 438/73 |
| 2014/0083487 | A1 | * | 3/2014 | Santoleri | ............... H01L 31/049 264/510 |
| 2015/0129018 | A1 | * | 5/2015 | Declerck | ................ H10F 19/85 136/251 |
| 2015/0349703 | A1 | * | 12/2015 | Morad | .................. H01L 31/049 136/251 |
| 2016/0163903 | A1 | * | 6/2016 | Yang | ........................ B23P 19/04 136/251 |
| 2017/0162736 | A1 | * | 6/2017 | Sethi | .................... H01L 31/0512 |
| 2018/0254738 | A1 | * | 9/2018 | Yang | ........................ H02S 40/36 |
| 2019/0088802 | A1 | * | 3/2019 | Kang | .................... H10F 71/103 |
| 2019/0386164 | A1 | * | 12/2019 | Shi | ....................... H01L 31/0512 |
| 2020/0007073 | A1 | * | 1/2020 | Nguyen | .................. H02S 20/25 |
| 2020/0350453 | A1 | * | 11/2020 | Terashita | .............. H01L 31/042 |
| 2022/0149213 | A1 | * | 5/2022 | Mensink | ................. H10F 77/00 |
| 2022/0149226 | A1 | * | 5/2022 | Zhang | .................... H10F 19/00 |

FOREIGN PATENT DOCUMENTS

| | | | | | |
|---|---|---|---|---|---|
| GB | 1473108 | A | * | 5/1977 | ........... H01L 31/048 |

* cited by examiner

*Primary Examiner* — Sadie White

(57) ABSTRACT

A PV laminate and methods of assembly are provided. The PV cells of exemplary PV laminates may comprise a shingled linear array of PV cells where one or more spacers are employed near the connections between adjacent PV cells of the linear array. These spacers can serve to reduce stresses during assembly of the PV laminate and may be later substantially subsumed in encapsulant once assembly of the PV laminate is completed.

16 Claims, 7 Drawing Sheets

Processes of Assembling a PV Laminate

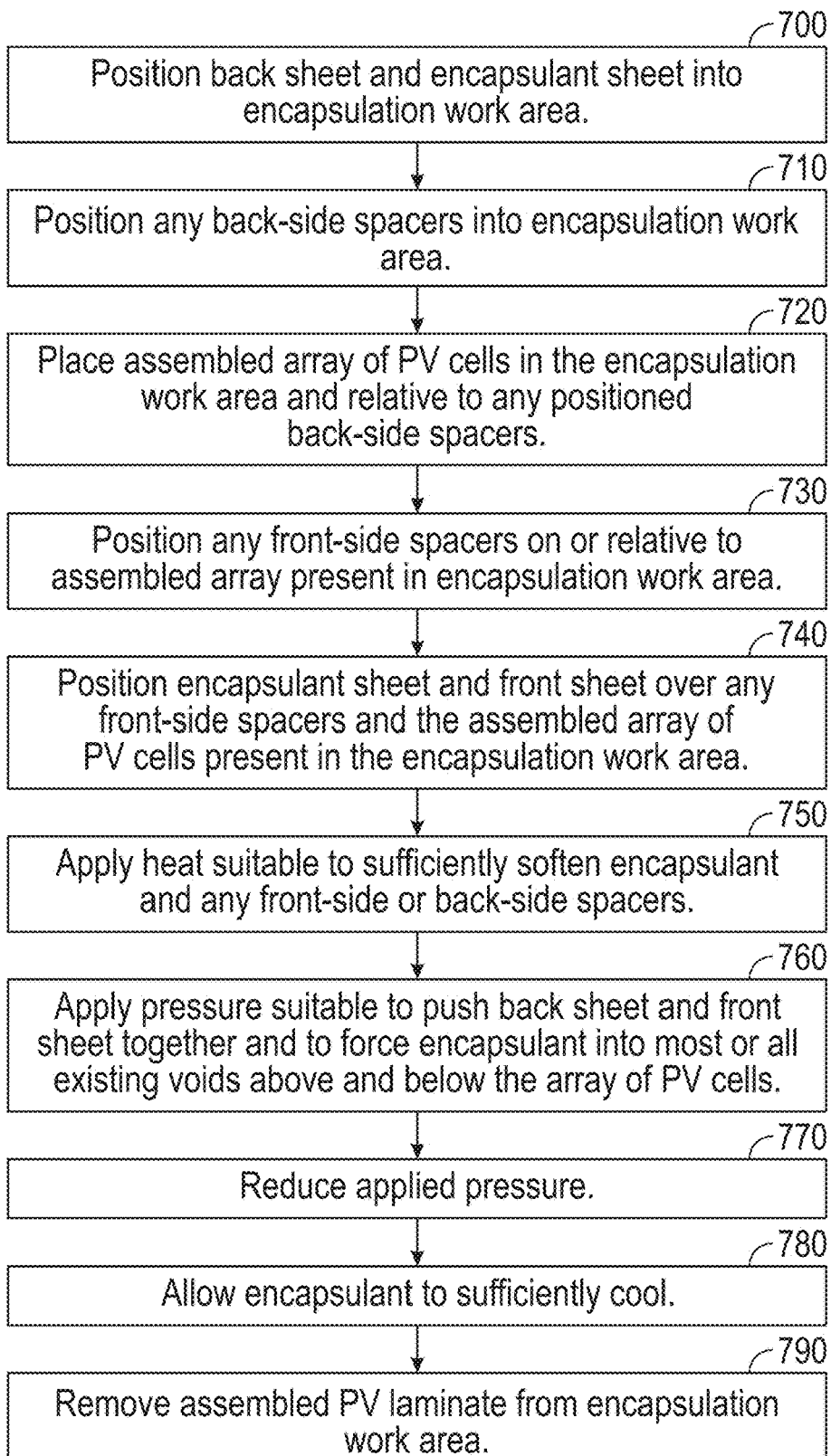

700

Position back sheet and encapsulant sheet into encapsulation work area.

710

Position any back-side spacers into encapsulation work area.

720

Place assembled array of PV cells in the encapsulation work area and relative to any positioned back-side spacers.

730

Position any front-side spacers on or relative to assembled array present in encapsulation work area.

740

Position encapsulant sheet and front sheet over any front-side spacers and the assembled array of PV cells present in the encapsulation work area.

750

Apply heat suitable to sufficiently soften encapsulant and any front-side or back-side spacers.

760

Apply pressure suitable to push back sheet and front sheet together and to force encapsulant into most or all existing voids above and below the array of PV cells.

770

Reduce applied pressure.

780

Allow encapsulant to sufficiently cool.

790

Remove assembled PV laminate from encapsulation work area.

FIG. 7

Processes of Assembling a PV Laminate

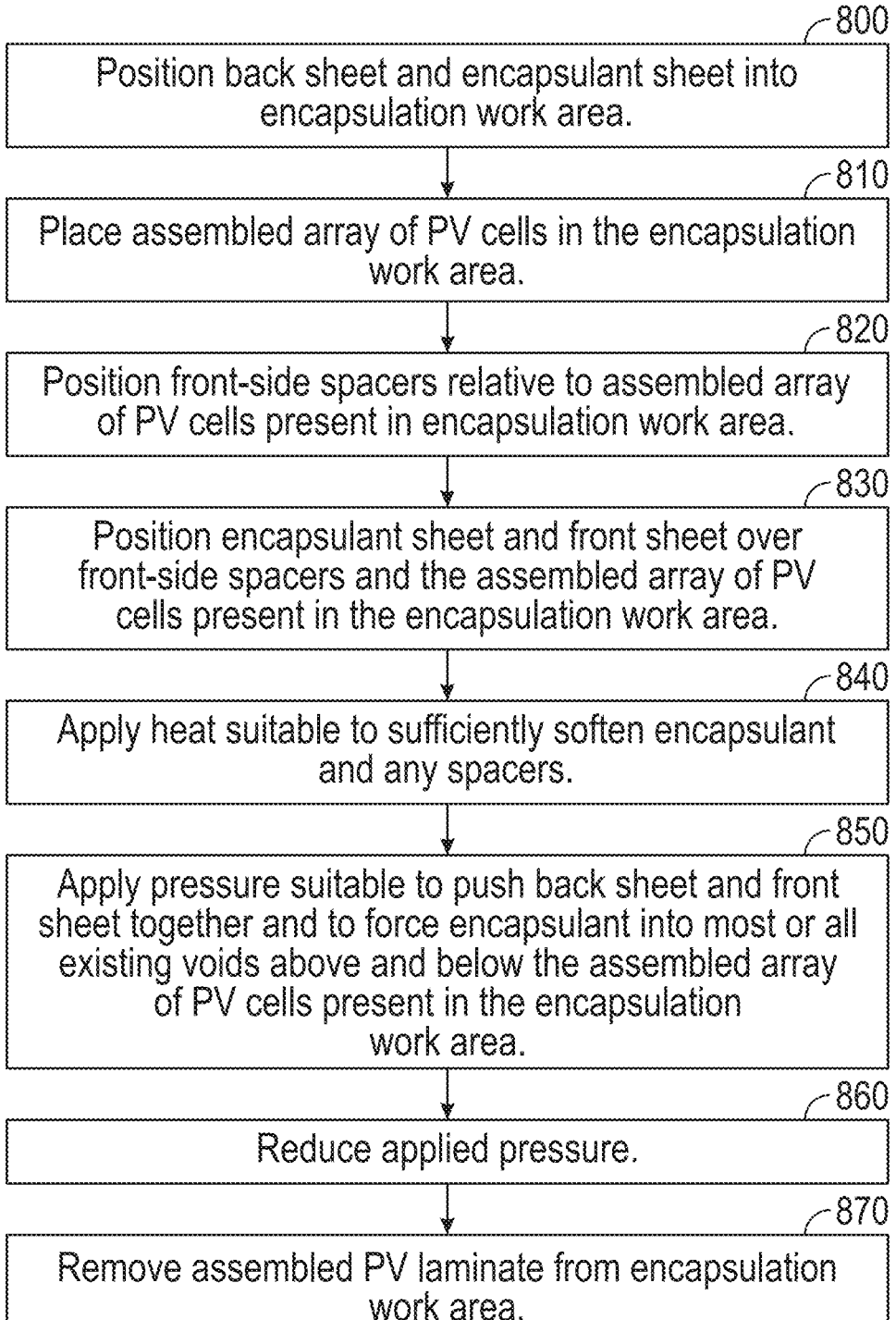

_800_
Position back sheet and encapsulant sheet into encapsulation work area.

_810_
Place assembled array of PV cells in the encapsulation work area.

_820_
Position front-side spacers relative to assembled array of PV cells present in encapsulation work area.

_830_
Position encapsulant sheet and front sheet over front-side spacers and the assembled array of PV cells present in the encapsulation work area.

_840_
Apply heat suitable to sufficiently soften encapsulant and any spacers.

_850_
Apply pressure suitable to push back sheet and front sheet together and to force encapsulant into most or all existing voids above and below the assembled array of PV cells present in the encapsulation work area.

_860_
Reduce applied pressure.

_870_
Remove assembled PV laminate from encapsulation work area.

FIG. 8

PV LAMINATE WITH SHINGLED PV CELLS AND METHODS OF ASSEMBLY

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

PV cells can be positioned next to each other to form a linear array of PV cells. Linear arrays of PV cells can be positioned adjacent to each other to form two-dimensional arrays of PV cells. PV cells in these linear arrays and two-dimensional arrays may lie fully along the same reference plane, e.g., PV cells may each be laying completely flat on an assembly surface. PV cells in linear arrays may also not be laying fully flat along the same reference plane and may, instead, e.g., be overlapping adjacent PV cells of their linear array. This overlapping orientation can be identified as being a shingled linear array of PV cells. The adjacent PV cells in linear arrays, whether shingled or not shingled, can be electrically connected in series to immediately adjacent PV cells of the particular linear array.

BRIEF DESCRIPTION OF THE DRAWINGS

FIG. 7 illustrates one or more actions that may be employed when performing processes of assembling a PV laminate, according to some embodiments.

FIG. 8 illustrates one or more actions that may be employed when performing processes of assembling a PV laminate, according to some embodiments.

DETAILED DESCRIPTION

Figure 1:
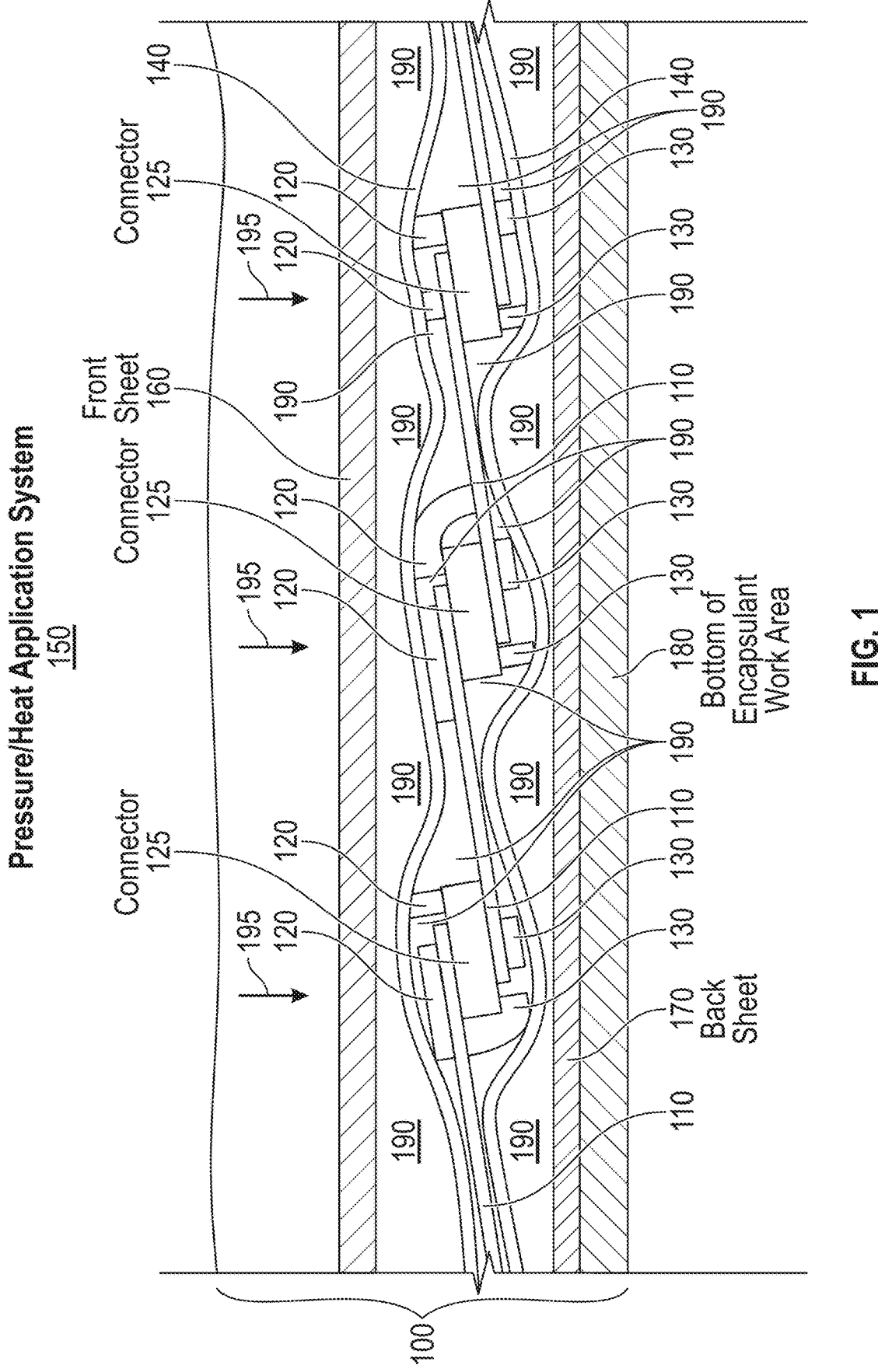
FIG. 1 illustrates a side view of an encapsulant work area during assembly of a PV laminate comprising a shingled linear array of PV Cells, front-side spacers, back-side spacers, and encapsulant, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112 (f) for that unit/component.

"First," "Second," etc. As used herein, these terms are used as labels for nouns that they precede, and do not imply any type of ordering (e.g., spatial, temporal, logical, etc.). For example, reference to a "first" linear array of PV cells does not necessarily imply that this linear array of PV cells is the first linear array of PV cells in a sequence, instead the term "first" is used to differentiate this linear array of PV cells from another linear array of PV cells (e.g., a "second" linear array of PV cells).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification describes PV laminate embodiments and features of PV laminate embodiments as well as process embodiments that may be employed during their assembly. These various examples may be combined in various ways including deleting and adding features from figures and text identified herein as well as their teachings. Likewise, the processes identified herein may be performed with more or fewer of the identified actions as well as in various orders and with variations of the actions themselves. Thus, embodiments may be drawn from teachings of various Figures and text of this disclosure.

Embodiments may comprise shingled PV cells that are electrically connected at one or more edge of the PV cell to a neighboring PV cell. PV cells next to each other may overlap along their edge and in so doing be considered "shingled" for purposes of this disclosure. In embodiments, this overlapping edge between neighboring PV cells may be electrically connected with various techniques. These techniques include soldering strips, lines, traces, vias, tac soldering, and other electrical connection techniques. The overlapping edge electrical connection may be susceptible to cracking stresses during encapsulation of the shingled PV cell linear array. These cracking stresses may be reduced through the use of one or more spacers positioned near the overlapping edge and sized to receive compressive forces administered during encapsulation of the shingled PV cell linear array. In embodiments, the spacers may have sizes that are greater than the thickness of the PV cells such that when a spacer is positioned near an overlapping edge between PV cells the spacer protrudes beyond the outer surface of the PV cell. By extending beyond the outer surface of the PV cell, a spacer can serve to reduce pressure being exerted on the overlapping edge and any electrical connections being made in or around the overlapping edge. In other words, as the spacer may extend above a surface of a PV cell, forces pressing down on the PV cell would first be received at the spacer rather than the surrounding surface area of the PV cell. These received forces can then be redirected in whole or in part through the spacer and downwards, rather than through the edge and any electrical connections. In so doing, cracking during manufacture, during use, or both, may be mitigated or eliminated.

In embodiments, the spacers may be located at various locations around an overlapping edge of neighboring PV cells and/or any neighboring PV cell electrical connections. This spacing can comprise one, two, three, and four or more spacers located around an overlapping edge—above and below—as may be needed to carry forces away from the electrical connections of an overlapping edge. Spacers of embodiments may be made from various materials. These can comprise similar or the same materials as encapsulant also being placed around the PV cells overlapping edges. The materials can also be different than encapsulant being placed around the PV cells overlapping edges. Exemplary materials may comprise soft transparent material or a bit harder and may have a thickness of similar to a battery or thicker or thinner. In some embodiments spacers may comprise one or more of the following: EVA, POE, EPE, silicone, or ionomer encapsulants. In some embodiments, the spacers may have a melting point that is low enough to allow them to melt and flow during encapsulation and lamination steps of a manufacturing process and sometimes be subsumed into the encapsulant. In some embodiments, the spacers may not deform or reform during encapsulation and lamination steps of a manufacturing process. Rather the spacers may remain and be surrounded by encapsulant as it melts and the encapsulant reforms around the spacers during manufacture.

Encapsulation and lamination steps of embodiments may include placing spacers above and/or below an array of shingled PV cells, placing encapsulant above and/or below the array of shingled PV cells, placing a back sheet below and a front sheet over encapsulant. Heat and pressure may then be applied to this stack of materials so as to laminate the materials together into a PV laminate. The pressure may be applied by various techniques including a roller or pressure plate or air bag. The heat may be applied by several methods as well including heated air flow, electrical resistance and chemical reactions. The duration and amount of pressure applied and heat applied may be set so that the encapsulant can deform or melt and fill voids and spaces between the back sheet and the front sheet and so that the front sheet and back sheet can be urged together to form a PV laminate.

Precision when placing the spacers and shingled PV cells in an encapsulation work area may be accomplished through the use of robotic placement, optical verification, mechanical alignment stencils or other techniques. In embodiments, the placement of the spacers relative to the shingled PV cells may be carried out to accuracy levels of 0.1 mm or less.

The linear arrays of shingled PV cells can comprise two, five, ten, twenty, thirty or more PV cells. These PV cells may be aligned in a row and rows may be placed adjacent to each other to form a two-dimensional array of shingled PV cells. Overlapping edges of neighboring PV cells, whether in a single row or a two-dimensional array, may have electrical connections. These connections may be protected from surface stress during manufacture by the use of the spacers identified herein. Placing one or more spacers as taught herein can serve to reduce stresses being transferred to the electrical connections and surrounding areas. These reduced stresses can increase the likelihood that little to no cracking of surrounding encapsulant or the electrical connections themselves may occur during manufacture. The electrical connections in some embodiments may comprise solder ribbon. Other electrical connection techniques may also be employed.

The spacers can be long strips of encapsulant or other material that is placed above and/or below the shingled PV cells. These elongated spacer strips may extend over several adjacent rows of shingled PV cells. Spacer strips may also be shorter, such that they extend over only part of a width of overlapping edges of connected PV cells of a linear array of shingled PV cells. Spacer strips may also extend over only a single width of overlapping edges of connected PV cells of a linear array of shingled PV cells. Other lengths and sizes may also be employed in embodiments. The spacers may employ different thickness and shapes so as to account for their placement relative to underlying or overlying materials and the electrical connections between overlapping PV cells the spacers are intended to protect. For example, spacers may have polygonal cross sections that accommodate the slanted orientation of overlapping PV cells and spacers may different thicknesses as well to account for the spacers relative position to nearby material. The thicknesses can be consistent along their length or vary as well such that different thicknesses of the spacers are present.

Embodiments may comprise processes of assembling a PV laminate, where the process may comprise some, all, none, and modifications of the teachings herein. Examples may include, positioning a PV laminate back sheet and a first PV laminate encapsulant sheet into a PV laminate encapsulation work area; positioning a first back-side spacer into the PV laminate encapsulation work area; the first back-side spacer having a length. After positioning the first back-side spacer, placing a plurality of linear arrays of shingled PV cells into the encapsulation work area, wherein once positioned, the first back-side spacer may extend above or below each of the linear arrays of the plurality of linear arrays. After positioning the plurality of linear array of shingled PV cells, positioning a first front-side spacer in the encapsulation work area, the first front-side spacer having a length. Positioning a second PV laminate encapsulant sheet and a PV laminate front sheet over the plurality of linear arrays of shingled PV cells in the encapsulation work area. Applying heat to at least a portion of the PV laminate encapsulation work area. Applying pressure to press the PV laminate back sheet and the PV laminate front sheet towards each other.

Examples may include maintaining the applied heat and the applied pressure for a predetermined period of time, e.g., one, two, three, five, and ten seconds or more, the applied heat, the applied pressure and the predetermined period of time sufficient to allow encapsulant of the first and second encapsulant sheets to move into most or all existing voids on a front-side and a back side of the linear arrays of the plurality of linear arrays of shingled PV cells. In some instances, each linear array of shingled PV cells of the plurality of linear arrays of shingled PV cells may comprise three PV cells. In some instances, the first back-side spacer may be adjacent to a back surface of each linear array of shingled PV cells of the plurality of linear arrays of shingled PV cells. In some instances, the first back-side spacer may traverse a surface of each linear array of shingled PV cells of the plurality of linear arrays of shingled PV cells. In some instances, the first front-side spacer may be adjacent to a light receiving surface of each linear array of shingled PV cells of the plurality of linear arrays of shingled PV cells. In some instances, the first front-side spacer may be positioned above the first back-side spacer. In some instances, the first front-side spacer may be positioned directly above the first back-side spacer. Still further, in some instances, the first front-side spacer may have a rectangular cross section and may have a length over 30 cm and wherein a temperature value of the heat applied may be greater than a melting point of the first PV laminate encapsulant sheet. Some instances may comprise positioning a second back-side spacer into the PV laminate encapsulation work area; the second back-side spacer may have an elongated shape; and after positioning the plurality of linear array of shingled PV cells, positioning a second front-side spacer in the encapsulation work area, the second front-side spacer may have an elongated shape.

Further embodiments may comprise a process of assembling a PV laminate, which may comprise positioning a PV laminate back sheet and a first PV laminate encapsulant into a PV laminate encapsulation work area, wherein after positioning the PV laminate back sheet, placing a first linear array of shingled PV cells into the encapsulation work area. Positioning a first front-side spacer in the encapsulation work area, the first front-side spacer having an elongated shape and extending across a width of the first linear array of shingled PV cells and positioning a second PV laminate encapsulant and a PV laminate front sheet over the first front-side spacer and over the first linear array of shingled PV cells may also be performed. Applying heat to the PV laminate encapsulation work area and applying pressure to press the PV laminate back sheet and the PV laminate front sheet towards each other may also be performed.

Some embodiments may comprise positioning a second front-side spacer in the encapsulation work area, the second front-side spacer having an elongated shape and extending across a width of the first linear array of shingled PV cells. In some embodiments, the second front-side spacer may be parallel to the first front-side spacer. In some embodiments, the first front-side spacer may be positioned above a first PV cell of the first linear array of shingled PV cells and the second front-side spacer may be positioned above a second PV cell of the first linear array of shingled PV cells. In some embodiments, the first front-side spacer, the second front-side spacer, the first PV laminate encapsulant, and the second PV laminate encapsulant may comprise the same material. In some embodiments, the first front-side spacer may be positioned adjacent to overlapping edges of adjacent PV cells of the first linear array of shingled PV cells.

Embodiments may comprise a first linear array of shingled PV cells; each PV cell of the first linear array having an overlapping edge with at least one other PV cell of the first liner array, the overlapping edge comprising an electrical connection between overlapping PV cells. Embodiments may comprise a front-side sheet atop the first linear array of shingled PV cells, a back-side sheet behind the first linear array of shingled PV cells, encapsulant positioned between the front-side sheet and the first linear array of shingled PV cells, encapsulant positioned between the back-side sheet and the first liner array of shingled PV cells, and a first spacer positioned between the encapsulant and a top side of the first linear array of shingled PV cells. In some embodiments, the first spacer may be positioned across a width of the first linear array of shingled PV cells, the first spacer may be positioned within 2 cm of an edge of a first PV cell of the first linear array of shingled PV cells, and the first spacer may be positioned within 4 cm of an edge of a second PV cell of the first linear array of shingled PV cells.

In some embodiments, the first spacer may have a polygonal cross-section. In some embodiments, the encapsulant and the first spacer may comprise the same material. Some embodiments may further comprise a second spacer positioned between the encapsulant and a top side of the first linear array of shingled PV cells. The second spacer may be positioned across a width of the first linear array of shingled PV cells, the second spacer may be positioned within 2 cm of an edge of a first PV cell of the first linear array of shingled PV cells, and the second spacer may be positioned within 4 cm of an edge of a second PV cell of the first linear array of shingled PV cells.

FIG. 1 illustrates a side view of an encapsulant work area 100 during assembly of a PV laminate having a shingled linear array of PV Cells 110, front-side spacers 120, back-side spacers 130, and encapsulant 140 according to some embodiments. Also labelled are pressure/heat application system 150, front sheet 160, back sheet 170, and bottom of encapsulant work area 180. In FIG. 1, the encapsulant 140 is shown as sheets of material although in other instances the encapsulant may have various other configurations when placed. These can include spheres, cubes, polygons, and other shapes that may be placed and may be later melted. As can be seen, when placed as a sheet, the encapsulant 140 can lie in contact with spacers 120 and 130 as well as with portions of the PV cells 110. The encapsulant 140 can also be spaced apart from each of the spacers 120 and 130 as well as the PV cells 110, as is also shown in FIG. 1. The front sheet 160 allows for light to pass through as reach the PV cells 110. The front sheet may be glass or a polymer or other transparent or translucent material and combinations thereof. There may even be portions of opaque material in the top sheet over areas not intended to pass light therethrough to underlying PV cells. The back sheet 170 may be transparent, translucent or opaque and may comprise glass or polymer or other transparent, translucent or opaque material. Arrows 195 show the downward direction of movement of the pressure/heat application system 150. As the system 150 moves in the direction of arrows 195, the front sheet 160 will be pressed towards the encapsulant 140, the PV cells 110, and the back sheet 170. Heat may also be applied by the system 150 such that the encapsulant, and perhaps the spacers 120 and 130 depending upon their composition, melt or otherwise soften to allow deformation and/or flow. This softening or deformation or flow of the encapsulant and perhaps the spacers 120 and 130 will seek to fill voids around the PV cells 110 and around the front sheet 160 and the back sheet 170. The bottom of the encapsulant work area 180 may be fixed or may be moveable. In either instance, the bottom 180 may serve to press the back sheet 170 or resist movement of the back sheet 170 such that the back sheet 170 and front sheet 160 become closer together when the system 150 is applying pressure and heat. This compaction may be intended to laminate the front sheet 160, the encapsulant 140, the PV cells 110, and the back sheet 170 together. The spacers 120 and 130 may also melt or may remain in form. In either instance, the spacers may serve to resist pressure around the connectors 125 of the PV cells such that lower levels of pressure or no additional amounts of pressure are felt by electrical connections of overlapping edges. Through the application of heat and pressure, the encapsulant 140 and perhaps the spacers 120 and 130, depending upon their composition and location, may flow into voids, such as voids 190 located between the front sheet 160 and the back sheet 170.

As can be seen in FIG. 1, the heights of the spacers 120 are such that as the back sheet 170 and the front sheet 160 move towards each other while in the encapsulant work area 100 and under the heat and pressure generated therein, the spacers 120 and 130 provide the likeliest initial points of contact for the back sheet 170 and front sheet 160. These initial points of contact with the sheets 160 and 170 can serve to direct compressive forces or other deleterious forces around the connectors 125 rather than directly through connectors 125. Such reduction of forces or circumvention of forces can serve to protect the electrical connections within the connectors 125 and ultimately the electrical connections between overlapping edges of the adjacent PV cells 110.

Various sizes and shapes and placements of the spacers 120 and 130 are shown in FIG. 1. These are exemplary as other shapes and placements may also be employed in embodiments. The sizing and placement of spacers 120 and 130 may be selected such that compressive forces imposed during lamination are reduced or circumvent the connectors 125 or other electrical connections of embodiments. Heat used for promoting flow of the encapsulant may come from above as shown in FIG. 1 but may also come from other areas of the encapsulant work area 100 in embodiments. The heat may be maintained prior to application of pressure and afterwards such that desired flow of encapsulant may occur. The pressure may be applied by various techniques. For one, the system 100 may employ an air bag that inflates to press the front sheet 160 and back sheet 170 together. Move rigid pressure generators, using a noncompressible fluid for example, may also be employed in embodiments.

Figure 2:
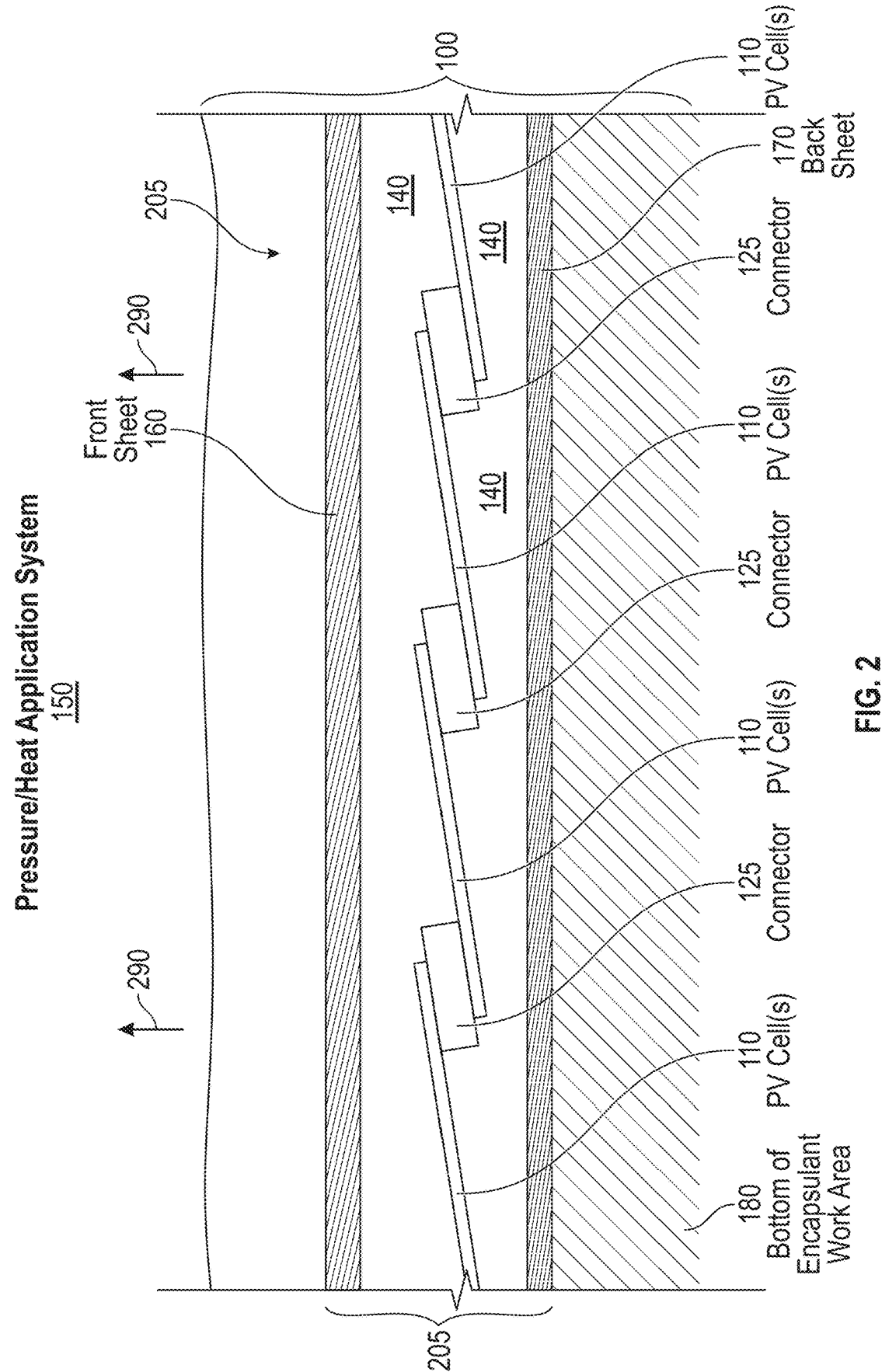
FIG. 2 illustrates a side view of the PV laminate of FIG. 1 after application of heat and pressure to components of the PV laminate in an encapsulant work area, according to some embodiments.

FIG. 2 illustrates a side view of the PV laminate of FIG. 1 after application of heat and pressure to components of the PV laminate according to some embodiments. The arrows 290 indicate that the pressure/heat application system 150 has moved up and away from being in contact with front sheet 160. Also shown in FIG. 2 is that encapsulant 140 has effectively enclosed the PV cells 110 and intervening connectors 125 of the now assembled PV laminate 205. FIG. 2 also shows that the spacers 120 and 130 of FIG. 1 have been effectively subsumed into the repositioned encapsulant 140 after the application of heat and pressure from the pressure/heat application system 150. In some embodiments portions or all of the spacers may remain in the encapsulant after lamination. The remnants of the spacers may depend upon the amount of heat applied, the duration of heat or pressure as well as the materials of the spacers. Other factors may also determine whether portions, none, or all of the spacers remain after lamination in embodiments.

Figures 3, 4:
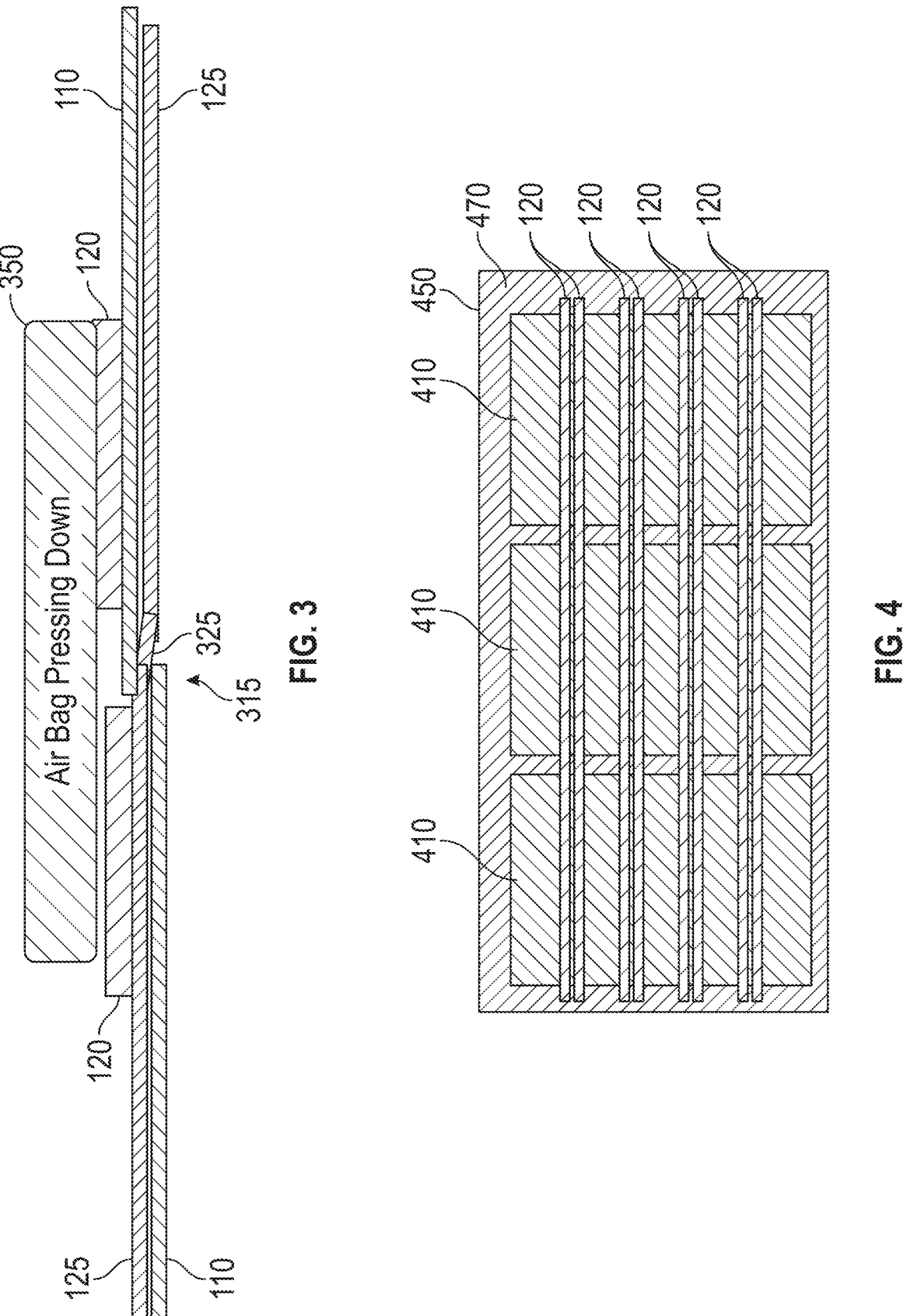
FIG. 3 illustrates a side view schematic of assembly of a PV laminate using front-side spacers, according to some embodiments.
FIG. 4 illustrates a plan view of the PV laminate of FIG. 3 without the presence of the air bag shown in FIG. 3, according to some embodiments.

FIG. 3 illustrates a side view schematic for assembly of a PV laminate using front-side spacers 120 according to some embodiments. Some components shown in FIGS. 1 and 2 are not present in this schematic. In FIG. 3, an airbag 350 is shown as an example of a pressure/heat application system. The front sheet, back sheet and encapsulant are also not shown so as to highlight the interaction between the illustrated components. In FIG. 3, the PV cells 110 can be seen overlapping each other at 315. Also shown is that connectors 125 are themselves electrically connected through 325. Here, the distal portions of connectors 125 may be electrically connected to a respective PV cell while the connector 325 may connect proximal ends of connectors 110. The entire three components may be considered an electrical connector as they serve to electrically connect to PV cells at the overhanging edges of the two adjacent PV cells. In use, when the air bag 350 presses down it will place more force on the spacers 120 and less on the tops of the PV cells 110 near the connector 125. In so doing, the connector 325 is spared from receiving much if any downward force from the air bag 350. In other embodiments, the airbag 350 or other pressure/heat application system may extend beyond the spacers 120 as shown in FIG. 3 and may also place pressure on the PV cells 110 or the connectors 125. But, here, too, pressure on the connector 325 and/or in the area of the overlap 315 may be reduced due to the presence of the spacers 120 when heat and/or pressure is being applied.

FIG. 4 illustrates a plan view of the PV laminate of FIG. 3 without the presence of the air bag shown in FIG. 3 and according to some embodiments. Three linear arrays of shingled PV cells 410 are shown in FIG. 4. Four pairs of spacers 120 are also shown. These pairs of spacers 120 extend completely across each linear array of shingled PV cells 410. The spacers 120 are also shown with a length multiple times greater than their width, so the spacers may be considered elongated. The spacers 120 also extend past the outside edges of the PV cells 410 but remain within the outer perimeter 450 of the back sheet 470. When the spacers 120 are laid down optical sensors or other highly accurate methods may be used so that the spacers are precisely placed relative to the locations of the PV cells 410.

Figures 5, 6:
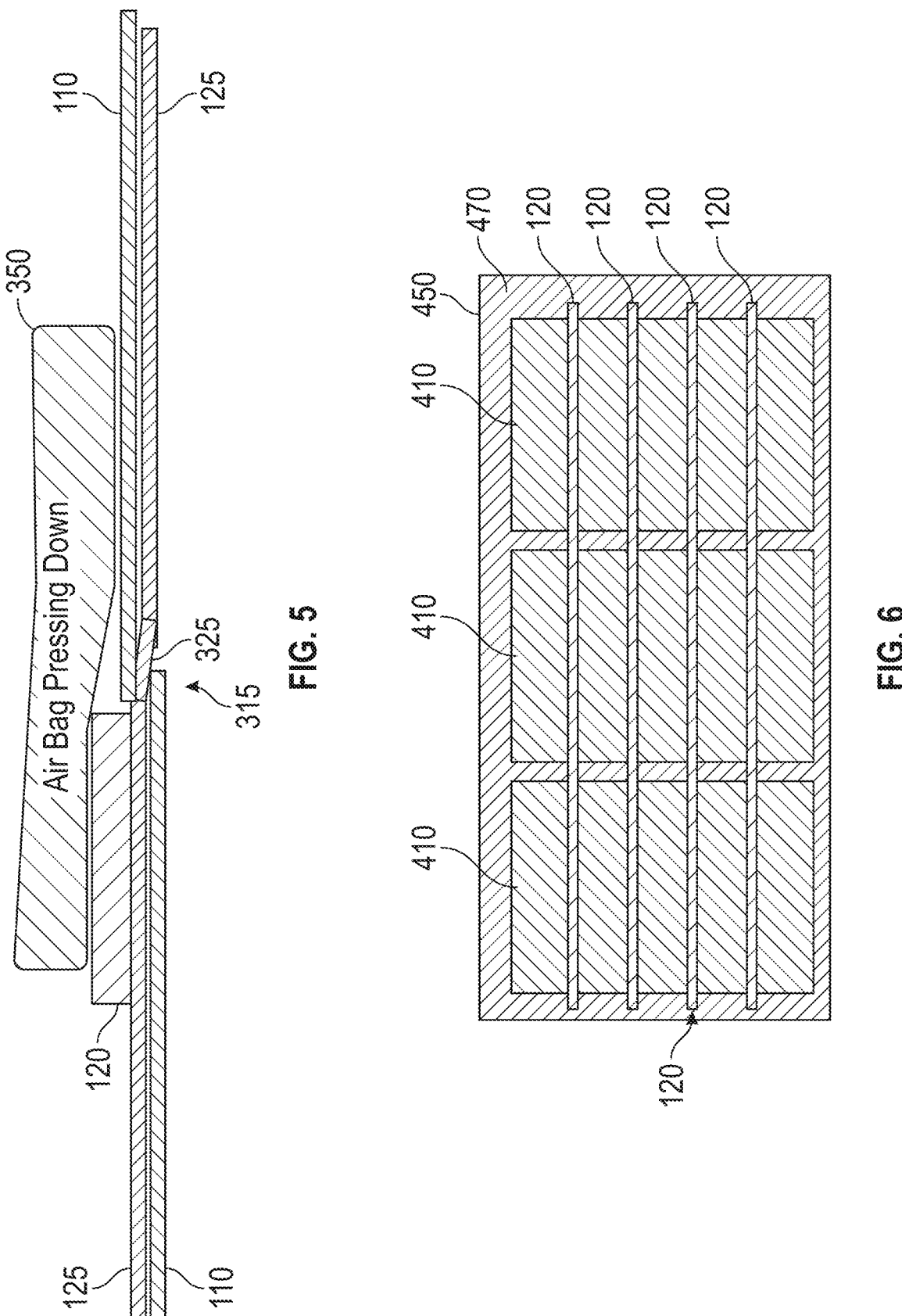
FIG. 5 illustrates a side view schematic of assembly of a PV laminate using front-side spacers, according to some embodiments.
FIG. 6 illustrates a plan view of the PV laminate of FIG. 5 without the presence of the air bag shown in FIG. 5, according to some embodiments.

FIG. 5 illustrates a side view schematic for assembly of a PV laminate using front-side spacer 120 according to some embodiments. FIG. 5 is an example of asymmetric spacer placement in embodiments. Some components shown in FIGS. 1 and 2 are not present in this schematic. In FIG. 5, an airbag 350 is shown as an example of a pressure/heat application system. The front sheet, back sheet and encapsulant are also not shown so as to highlight the interaction between the illustrated components. In FIG. 5, the PV cells 110 can be seen overlapping each other at 315. Also shown is that connectors 125 are themselves electrically connected through 325. Here, the distal portions of connectors 125 may be electrically connected to a respective PV cell while the connector 325 may connect proximal ends of connectors 110. The entire three components, and each component itself, may be considered an electrical connector as they serve to electrically connect to PV cells at the overhanging edges of the two adjacent PV cells. In use, when the air bag 350 presses down it will place larger force on the spacer 120 and the PV cell 110s and less force on the connector 325 or PV cell overlap 315. In so doing, the connector 325 is spared from receiving much if any downward force from the air bag 350. In this embodiment, like some others, the airbag 350 or other pressure/heat application system may extend beyond the spacer 120 as shown in FIG. 5 and may also place pressure on the PV cells 110 or the connectors 125. But, as noted above, pressure on the connector 325 and/or in the area of the overlap 315 may be reduced due to the presence of the spacer 120 when heat and/or pressure is being applied.

FIG. 6 illustrates a plan view of the PV laminate of FIG. 5 without the presence of the air bag shown in FIG. 5 and according to some embodiments. Three linear arrays of shingled PV cells 410 are shown in FIG. 4. Four single spacers 120 are also shown. These single spacers 120 extend completely across each linear array of shingled PV cells 410. The spacers 120 are also shown with a length multiple times greater than their width, so the spacers may be considered elongated. The spacers 120 also extend past the outside edges of the PV cells 410 but remain within the outer perimeter 450 of the back sheet 470. When the spacers 120 are laid down optical sensors or other highly accurate methods may be used so that the spacers are precisely placed relative to the precise locations of the PV cells 410.

FIG. 7 illustrates potential actions that may be employed when performing processes of assembling a PV laminate according to some embodiments. The potential actions or other features of processes of embodiments may include the following or others in this and different orders of performance. Some, more, or none of the following may be included in embodiments. FIG. 7 shows at 700 that processes may include positioning a back sheet and encapsulant sheet into an encapsulation work area. Processes may also include, as shown at 710, positioning any back-side spacers into an encapsulation work area and 720 shows placing assembled arrays of PV cells in an encapsulation work area and relative to any positioned back-side spacers. Processes may also include, as shown at 730, positioning any front-side spacers on or relative to assembled array present in encapsulation work area and 740 of FIG. 7 shows positioning encapsulant sheet(s) and front sheet(s) over any front-side spacers and the assembled array of PV cells present in the encapsulation work area. Embodiments may also include, applying heat suitable to sufficiently soften encapsulant and any front-side or back-side spacers, as shown at 750 and applying pressure suitable to push back sheet and front sheet together and to force encapsulant into most or all existing voids above and below the array of PV cells, as shown at 760. FIG. 7 at 770 shows reducing applied pressure while 780 shows allowing encapsulant to sufficiently cool and 790 shows removing assembled PV laminate from encapsulation work area. Each of which may be performed in some embodiments.

FIG. 8 illustrates potential actions that may be employed when performing processes of assembling a PV laminate according to some embodiments. The potential actions or other features of processes of embodiments may include the following or others in this and different orders of performance. Some, more, or none of the following may be included in embodiments. FIG. 8 shows at 800 positioning back sheet and encapsulant sheet into encapsulation work areas. FIG. 8 at 810 provides for placing assembled arrays of PV cells in the encapsulation work area and at 820 positioning front-side spacers relative to assembled array of PV cells present in encapsulation work area. FIG. 8 at 830 provides for positioning encapsulant sheets and front sheets over front-side spacers and the assembled array of PV cells present in the encapsulation work area. FIG. 8 at 840 provides for applying heat suitable to sufficiently soften encapsulant and any spacers. 850, of FIG. 8, provides for applying pressure suitable to push back sheet and front sheet together and to force encapsulant into most or all existing voids above and below the assembled array of PV cells present in the encapsulation work area, while 860 provides for reducing applied pressure and 870 describes removing assembled PV laminate from the encapsulation work area.

Figure 9:
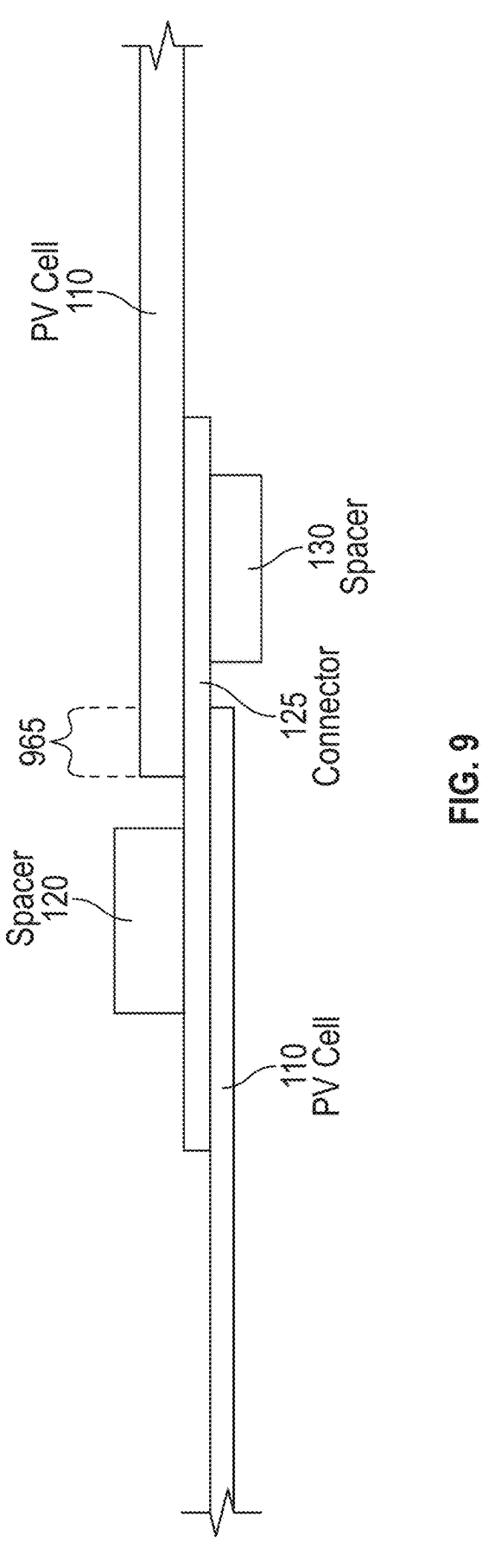
FIG. 9 illustrates a side view schematic of assembly of a PV laminate using front-side spacer and back-side spacer, according to some embodiments.

FIG. 9 shows a side view schematic of assembly of a PV laminate using front-side spacer 120 and back-side spacer 130, according to some embodiments. FIG. 9 is an example of symmetric spacer placement in embodiments. Some components shown in FIGS. 1 and 2 are not present in this schematic. In FIG. 9, an airbag, which is not shown, may be employed, as an example of a pressure/heat application system. The front sheet, back sheet and encapsulant are also not shown so as to highlight the interaction between the illustrated components. In FIG. 9, the PV cells 110 can be seen overlapping each other at 965. Also shown is that connectors 125 are themselves a single sheet electrically connected to both PV cells 110. Here, the distal portions of connectors 125 may be electrically connected to a respective PV cell 110 while the center of the connector may be a continuous piece. The areas of the connector 125 may cumulatively be considered an electrical connector as they serve to electrically connect to PV cells at the overlapping edges of the two adjacent PV cells. In use, when an air bag or other pressure heat application system presses down it will place larger force on the spacer 120 and spacer 130 than the PV cells 110 near and around the overlap 926. In so doing, the connector 125 near the overlap 965 is spared from receiving much if any shear force during application of compressive forces to melt and adhere the laminate being assembled together. In this embodiment, like some others, an airbag or other pressure/heat application system may extend beyond the spacer 120 as shown in FIG. 9 and may also place pressure on the PV cells 110 or the connector 125. But, as noted above, pressure in the area of the overlap 965 may be reduced due to the presence of the spacer 120 and spacer 130 when heat and/or pressure is being applied.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A process of assembling a PV laminate, the process comprising:

positioning a PV laminate back sheet and a first PV laminate encapsulant sheet into a PV laminate encapsulation work area;

positioning a first back-side spacer into the PV laminate encapsulation work area; the first back-side spacer having a length, after positioning the first back-side spacer, placing a plurality of overlapping linear arrays of PV cells into the encapsulation work area, wherein once positioned, the first back-side spacer extends above or below each of the linear arrays of the plurality of linear arrays, the first back-side spacer having a lateral width smaller than a lateral width of an individual PV cell of the plurality of overlapping linear arrays of PV cells, wherein a first linear array of the plurality of overlapping linear arrays of PV cells comprises a first PV cell, and a second linear array of the plurality of overlapping linear arrays of PV cells comprises a second PV cell, the first linear array being shingled over the second linear array, the first PV cell having a light receiving side, and the second PV cell having a light receiving side;

after positioning the plurality of overlapping linear arrays of PV cells, positioning a first front-side spacer over the first linear array, the first front-side spacer having a length, the first front-side spacer having a lateral width smaller than a lateral width of an individual PV cell of the plurality of overlapping linear arrays of PV cells;

positioning a second PV laminate encapsulant sheet and a PV laminate front sheet over the plurality of overlapping linear arrays of PV cells in the encapsulation work area;

applying heat to at least a portion of the PV laminate encapsulation work area; and applying pressure to press the PV laminate back sheet and the PV laminate front sheet towards each other.

2. The process of claim 1 further comprising:

maintaining the applied heat and the applied pressure for a predetermined period of time, the applied heat, the applied pressure and the predetermined period of time sufficient to allow encapsulant of the first and second encapsulant sheets to move into most or all existing voids on a front-side and a back side of the linear arrays of the plurality of overlapping linear arrays of PV cells.

3. The process of claim 1 wherein each linear array of PV cells of the plurality of linear arrays of PV cells comprises three PV cells.

4. The process of claim 1 wherein the first back-side spacer is adjacent to a back surface of each linear array of PV cells of the plurality of overlapping linear arrays of PV cells.

5. The process of claim 1 wherein the first back-side spacer traverses a surface of each linear array of PV cells of the plurality of overlapping linear arrays of PV cells.

6. The process of claim 1 wherein the first front-side spacer is adjacent to a light receiving surface of each linear array of PV cells of the plurality of overlapping linear arrays of PV cells.

7. The process of claim 1 wherein the first front-side spacer is positioned above the first back-side spacer.

8. The process of claim 1 wherein the first front-side spacer is positioned directly above the first back-side spacer.

9. The process of claim 1 wherein the first front-side spacer has a rectangular cross section and has a length over 30 cm and wherein a temperature value of the heat applied is greater than a melting point of the first PV laminate encapsulant sheet.

10. The process of claim 1 further comprising:

positioning a second back-side spacer into the PV laminate encapsulation work area; the second back-side spacer having an elongated shape; and after positioning the plurality of overlapping linear arrays of PV cells, positioning a second front-side spacer in the encapsulation work area, the second front-side spacer having an elongated shape.

11. A process of assembling a PV laminate, the process comprising:

positioning a PV laminate back sheet and a first PV laminate encapsulant into a PV laminate encapsulation work area;

placing a first linear array of shingled PV cells in the encapsulation work area, the first linear array comprising a first PV cell and a second PV cell, the first PV cell having a light receiving side, the light receiving side having a portion that overlaps and is positioned above the second PV cell;

positioning a first front-side spacer in the encapsulation work area and above the first PV cell, the first front-side spacer having an elongated shape and extending across a width of the first linear array of shingled PV cells, and the first front-side spacer having a lateral width smaller than a lateral width of an individual PV cell of the first linear array of shingled PV cells;

positioning a second PV laminate encapsulant and a PV laminate front sheet over the first front-side spacer and over the first linear array of shingled PV cells;

applying heat to the PV laminate encapsulation work area; and applying pressure to press the PV laminate back sheet and the PV laminate front sheet towards each other.

12. The process of assembling a PV laminate of claim 11 further comprising:

positioning a second front-side spacer in the encapsulation work area, the second frontside spacer having an elongated shape and extending across a width of the first linear array of shingled PV cells.

13. The process of assembling a PV laminate of claim 12 wherein the second front-side spacer is parallel to the first front-side spacer.

14. The process of assembling a PV laminate of claim 12 wherein the first frontside spacer is positioned above a first PV cell of the first linear array of shingled PV cells and the second front-side spacer is positioned above a second PV cell of the first linear array of shingled PV cells.

15. The process of assembling a PV laminate of claim 12 wherein the first frontside spacer, the second front-side spacer, the first PV laminate encapsulant, and the second PV laminate encapsulant comprise the same material.

16. The process of assembling a PV laminate of claim 11 wherein the first front-side spacer is positioned above any and all overlapping edges of adjacent PV cells of the first linear array of shingled PV cells.

* * * * *